(12) United States Patent
Niederloehner (10) Patent No.: US 10,094,861 B2
(45) Date of Patent: Oct. 9, 2018

(54) METHOD AND APPARATUS FOR DETERMINING A SYSTEM FREQUENCY IN MAGNETIC RESONANCE IMAGING

(71) Applicant: Siemens Aktiengesellschaft, Munich (DE)

(72) Inventor: Daniel Niederloehner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 287 days.

(21) Appl. No.: 15/074,212

(22) Filed: Mar. 18, 2016

(65) Prior Publication Data

US 2016/0274156 A1 Sep. 22, 2016

(30) Foreign Application Priority Data

Mar. 20, 2015 (DE) .................... 10 2015 205 055

(51) Int. Cl.
*G01R 23/16* (2006.01)
*G01R 33/48* (2006.01)
*G01R 33/58* (2006.01)

(52) U.S. Cl.
CPC ......... *G01R 23/16* (2013.01); *G01R 33/4828* (2013.01); *G01R 33/583* (2013.01)

(58) Field of Classification Search
CPC ... G01R 23/16; G01R 33/583; G01R 33/4828
USPC ........................................................ 702/76
See application file for complete search history.

(56) References Cited

U.S. PATENT DOCUMENTS 5,912,558 A 6/1999 Halamek et al.
2010/0283463 A1* 11/2010 Lu .................. G01R 33/243
324/309

OTHER PUBLICATIONS

Poullet et al: "MRS signal quantitation: A review of time- and frequency domain methods", Journal of Magnetic Resonance, vol. 195; pp: 134-144, (2008).
Kang et al: "Spatio-Spectral Mixed Effects Model for Functional Magnetic Resonance Imaging Data"; Journal of the American Statistical Association; vol. 107 No. 498; pp: 568-577; (2012).
Slotboom et al: "Versatile Frequency domain Fitting Using Time Domain Models and Prior Knowledge"; Magnetic Reson. Med. vol. 39; pp. 899-911, (1998).
Ahmad M , Liu Y, Slavens ZW, Low R, Merkle E, Hwang KP, Vu A, Ma J.Magn Reson Imaging. Apr. 2010;28(3):427-33. A method for automatic identification of water and fat images from a symmetrically sampled dual-echo Dixon technique.†
(Continued)

*Primary Examiner* — Anthony Ho
(74) *Attorney, Agent, or Firm* — Schiff Hardin LLP (57) ABSTRACT

In a method, device and magnetic resonance (MR) system for determining a system frequency in MR imaging, a frequency spectrum of a region under examination is acquired. A cost function (FOM) is determined that encompasses the difference between a parameterized model function having assigned parameters that is to be optimized, and the acquired frequency spectrum. The cost function is subsequently minimized. Furthermore, the parameters of the optimized parameterized model function assigned to the determined minimum are determined and the system frequency is calculated on the basis of the determined parameters.

14 Claims, 4 Drawing Sheets

(56) References Cited

OTHER PUBLICATIONS

Reeder SB , Wen Z, Yu H, Pineda AR, Gold GE, Markl M, Pelc NJ. Magn Reson Med. Jan. 2004;51(1):35-45. Multicoil Dixon chemical species separation with an iterative leastsquares estimation method.†

Lu W , Hargreaves BA. Magn Reson Med. Jul. 2008;60(1):236-44. Multiresolution field map estimation using golden section search for water-fat separation.†

\* cited by examiner
† cited by third party

METHOD AND APPARATUS FOR DETERMINING A SYSTEM FREQUENCY IN MAGNETIC RESONANCE IMAGING

BACKGROUND OF THE INVENTION

Field of the Invention

The invention concerns a method for determining a system frequency in magnetic resonance (MR) imaging, as well as a system frequency determination device and a magnetic resonance system.

Description of the Prior Art

The object of frequency adjustment prior to an MR image data acquisition procedure capture process is a reliable and precise determination of the water frequency, which is also referred to as the system frequency. The so-called water frequency corresponds to the frequency of the protons bound in water. The determination is necessary because, when MR diagnostic data are subsequently acquired, the magnetic field can be modified by the introduced object under examination and depends on the location of the measurement in the MR scanner.

In order to ensure a reliable frequency adjustment, maxima of an acquired spectral distribution of MR signals must be analyzed, correctly determined, and finally assigned to the correct substance, such as fat, water or silicone.

The frequency adjustment is conventionally based on the determination of a cross-correlation between an acquired frequency spectrum and a model having two maxima (water and fat at −3.4 ppm of water). This approach functions reasonably well if exactly two maxima are present in the acquired spectrum. If, however, only a single maximum is determined, there is a special procedure in order to determine whether the single maximum is assigned to the substance fat or the substance water. In this situation, again on the basis of a cross-correlation, small secondary maxima are sought on both sides of the primary maximum. If no clear indication can be found for fat or water, the primary maximum is assigned to the substance water. If a switch has previously been operated on the MR system, the operation of which switch is based on the assumption that the fat dominates the MR imaging, then the primary maximum is assigned to the substance fat.

In addition, in the case of chest examinations, the substance silicone can also occur, which involves a third frequency component (at −4.5 ppm of water) in the measured frequency spectrum. A special mode in which silicone is taken into consideration in a model having two maxima can conventionally also be activated in this case, wherein fat is replaced by silicone. In the case of an unclear detection of a single maximum it is defined that the primary maximum is assigned to the substance silicone.

In the conventional method using cross-correlation, widths of the maxima, amplitude ratios and frequency positions of the maxima of the model are compared with the measured signal or the measured frequency spectrum. On current MR systems having highly optimized numeric programs this process requires approximately 300 ms. If in addition a search for a special single maximum is performed, as has been described above, then even more computing time and run time are needed. If a third maximum is also taken into consideration in the calculations, as in the case of the occurrence of silicone, then the computing time with the conventional approach is in the order of minutes, which is not acceptable.

SUMMARY OF THE INVENTION

An object of the present invention is to provide a more effective method for determining a system frequency in MR imaging, which in particular requires less time.

In the method according to the invention for determining a system frequency in MR imaging, a frequency spectrum is first determined for a region under examination. A global frequency spectrum is acquired when the frequency spectrum is determined.

The acquired MR signals can be converted, for example, by a Fourier transformation into frequency spectra. The frequency spectrum can have, for example, a particular "length", where a "length" of the frequency spectrum can be understood to be the number of measuring points in the frequency domain for a predetermined spectral resolution of the measurement. Furthermore, on the basis of the acquired frequency spectrum, a cost function is determined that encompasses the difference between a parameterized model function having assigned parameters, which is to be optimized, and the acquired frequency spectrum. In this situation the parameterized model function models the measured frequency spectrum with the aid of a plurality of parameters. The cost function is subsequently minimized. The minimization can be carried out for example with the aid of an iterative or other optimization method. Subsequently, the parameters of the optimized parameterized model function which are assigned to the determined minimum are determined. Finally, the system frequency is determined on the basis of the determined parameters.

In this context, a cost function is to be understood as a function in which a deviation from a behavior expected for theoretical or modeling reasons is accompanied by an increase in the function value.

In contrast to the conventional approach in which the parameter space is simply scanned and every combination of parameters is calculated, according to the invention an optimization method is applied. Due to the convergence achieved during the optimization the method according to the invention is considerably more effective and faster than the conventional approach, which means that a model function having more than two maxima, for example a model function for water, fat and silicone, can also be adjusted to the measured frequency spectrum within an acceptable timeframe. With the aid of the optimization algorithm according to the invention an attempt is made to achieve the best match between the measured signal and the model function. This is achieved by minimizing the cost function.

The system frequency determination device according to the invention has an input interface for the acquisition of a frequency spectrum of a region under examination. In addition the system frequency determination device according to the invention has a cost function determination processor for determining a cost function which encompasses the difference between a parameterized model function and the acquired frequency spectrum. Part of the system frequency determination device according to the invention is also an optimization processor for the iterative minimization of the cost function. The system frequency determination device furthermore has an evaluation processor for determining the parameters of the parameterized model function assigned to the determined minimum. Finally, the system frequency determination device according to the invention also has a system frequency determination processor for determining the system frequency on the basis of the determined parameters of the parameterized model function. These processors can be separate or combined.

The magnetic resonance imaging system according to the invention has a control computer that is configured to control the magnetic resonance imaging system using the method according to the invention, and that has a system frequency determination device according to the invention.

The basic components of the system frequency determination device according to the invention can be designed in the form of software components. This concerns in particular the cost function determination device, the optimization unit and the evaluation unit. In principle these components can also to some extent, particularly where fast calculations are involved, be implemented in the form of software-supported hardware, for example FPGAs or the like. The required interfaces, for example if this involves only a transfer of data from other software components, can likewise be designed as software interfaces. They can also be designed as interfaces of hardware construction that are controlled by means of suitable software.

The system frequency determination device can be part of a user terminal or of a control computer of a magnetic resonance imaging system.

A largely software implementation has the advantage that control units or terminals or other host systems already previously in use can also be upgraded in a simple manner by means of a software update in order to operate in the manner according to the invention. In this respect the object is also achieved by a non-transitory, computer-readable data storage medium that can be loaded directly into a memory of a control computer of a magnetic resonance system, having program code in order to execute all the steps of the method according to the invention when the program code is executed in the control computer. The memory can be, for example, part of the control computer or part of a host system of a magnetic resonance system.

In an embodiment of the method according to the invention the parameterized model function includes as parameters a peak width, a peak amplitude and also a center frequency.

The model function on which the method according to the invention is based may be as follows:

$$m(f) = \sqrt{\sum_{i=1}^{2\,or\,3} (a_i \cdot L^{RE}(f, f_i^0, w_i))^2 + (a_i \cdot L^{IM}(f, f_i^0, w_i))^2} \quad (1)$$

where the Lorentzian functions $L^{RE}$ and $L^{IM}$ are as follows:

$$L^{RE}(f, f_i^0, w_i) = \frac{\frac{1}{12}w_i^2}{\frac{1}{12}w_i^2 + (f - f_i^0)^2}, \quad (2)$$

$$L^{IM}(f, f_i^0, w_i) = \frac{\frac{1}{2\sqrt{3}}w_i(f - f_i^0)}{\frac{1}{12}w_i^2 + (f - f_i^0)^2}, \quad (3)$$

where m(f) is the model function dependent on the frequency f, $f_i^0$ is the center frequency of the Lorentzian maximum, $w_i$ represents the width of the Lorentzian maximum and $a_i$ represents the amplitude of the Lorentzian maximum. A maximum of a frequency spectrum which can be modeled with the aid of the stated Lorentzian functions of the equations 2 and 3 is to be understood as the Lorentzian maximum.

In the method according to the invention, the cost function preferably is the sum of the squares of the difference between the parameterized model function and the acquired frequency spectrum. Deviations between model function and acquired frequency spectrum are incorporated squared in such a cost function.

The aforementioned cost function is based on a regression using the method of least squares, which corresponds to the classic adjustment of a curve, but wherein additional restrictions and boundary conditions preferably apply. The cost function is furthermore preferably normalized in order to ensure comparability.

In an embodiment of the method according to the invention the cost function has weighting parameters that effect a restriction in respect of the differences of the widths of the maxima and the heights of the various maxima of the parameterized model function to be optimized. The model function on which the method according to the invention is based can preferably be parameterized with respect to the differences of the widths of the maxima and the heights of the maxima of the various maxima. In other words, the aforementioned parameters will only be adjusted during the optimization of the cost function. However, since the values of the stated parameters, as is known on an empirical basis, approximate to certain values it is expedient to take due account of a deviation therefrom in the cost function.

With the use of the cost function, restrictions are set during the optimization process for the parameters of the width $w_i$ of the maxima and of the amplitude $a_i$ of the maxima of the frequency spectrum or of the corresponding model function. At the same time, a restriction of the positions of the maxima is also defined, albeit in an indirect manner, with the aid of the cost function.

A cost function FOM can be read as follows:

$$FOM = \left(1 + \sum_{j=1}^{2} \alpha_j c_j\right) \cdot \frac{1}{n} \sum_{k=1}^{n} (s(f_k) - m(f_k))^2, \quad (4)$$

where $m(f_k)$ is the model function in the case of the frequency position $f_k$, $s(f_k)$ is the signal of the frequency spectrum at the frequency position $f_k$, n is the length of the model function and of the measured signal vector, $c_j$ represents a restriction factor and $\alpha_j$ represents the weighting factor of the restriction by the restriction factor; the number of restriction factors is limited to 2 in this specific case but may also have a different value.

For the case of a model function $m(f_k)$ having two maxima (specifically quoted here for fat and water but not limited thereto) the restriction factors are for example defined as follows:

$$c_1 = \left(\frac{f_1^0 - f_2^0 - \Delta_{water}^{fat}}{dist_{rel\_peak} \cdot f_s}\right)^2, \quad (5)$$

$$c_2 = \left(\frac{w_1 - w_2}{\frac{1}{2}(w_1 + w_2)}\right)^2, \quad (6)$$

where $c_1$ represents a restriction factor of the distances of the frequencies of the maxima, $\alpha 1$ represents a weighting factor for the restriction factor of the distances of the frequencies of the maxima, $dist_{rel\_peak}$ represents a scaling factor for the restriction of the distances of the frequencies of the maxima, which for example can have the value 0.6, $c_2$ represents a restriction factor for a positive correlation of the widths of the maxima, $\alpha_2$ represents a weighting factor for the restriction factor of the positive correlation of the widths of the maxima, $\Delta^{fat}_{water}$ defines a predetermined reference distance between the maxima of the two predominant substances in the region under examination, for example fat and water, and $f_s$ is the system frequency. The system frequency here is the frequency which has most recently been defined as the water frequency (this was therefore used to carry out the measurement which delivers the data for the frequency spectrum). Theoretically, the system frequency results from the Larmor constant of the water protons multiplied by the field strength of the MR system.

If the model function is extended to three different substances, then the restriction factors become correspondingly more complex; they are then for example:

$$c_1 = \left( \frac{f_1^0 - f_2^0 - \Delta^{fat}_{water}}{dist_{rel\_peak} \cdot f_s} \right)^2 + \left( \frac{f_1^0 - f_3^0 - \Delta^{silicone}_{water}}{dist_{rel\_peak} \cdot \frac{\Delta^{silicone}_{water}}{\Delta^{fat}_{water}} \cdot f_s} \right)^2, \quad (7)$$

$$c_2 = \frac{(w_1 - w_2)^2 + (w_1 - w_3)^2 + (w_2 - w_3)^2}{\left( 3 \cdot \frac{1}{3}(w_1 + w_2 + w_3) \right)^2}, \quad (8)$$

where $c_1$ represents a restriction factor of the distances of the frequencies of the maxima, $\alpha_1$ represents a weighting factor for the restriction factor of the distances of the frequencies of the maxima, $dist_{rel\_peak}$ represents a scaling factor for the restriction of the distances of the frequencies of the maxima, which for example can have the value 0.6, $c_2$ represents a restriction factor for a positive correlation of the widths of the maxima, $\alpha_2$ represents a weighting factor for the restriction factor of the positive correlation of the widths of the maxima, $\Delta^{fat}_{water}$, $\Delta^{silicone}_{water}$ define a predetermined reference distance between the maxima of the respective predominant substances in the region under examination, for example fat and water or silicone and water, and $f_s$ is the system frequency.

The basis of the restriction factor c1 of the distances of the frequencies of the maxima is the fact that, in contrast to conventional approaches, no fixed distances between the maxima are defined in the model function. In reality the distance between the maxima is not always the distance predicted by the theoretical model, which can be attributed to an inhomogeneity of the magnetic fields or variable fat content. Therefore with regard to the optimization according to the invention of the theoretical model, it is permitted to change the distance of the maxima during the optimization, but costs arise for the deviation from the theoretical ideal value.

The basis of the restriction factor c2 is the fact that unequal widths of the maxima are permitted for different substances, but are also monitored. It is theoretically assumed that the widths of the maxima are equal owing to the same underlying magnetic field. The widths of the maxima vary in reality, however, the maximum for fat being somewhat wider due to the diversity of fatty components and of the corresponding frequencies and the spatially varying inhomogeneity of the magnetic field. In general the widths are correlated positively, which should be ensured by the restriction $c_2$. In the cost function FOM, increasing differences in the width of the maxima are therefore penalized by means of costs increasing as a square function.

Since a fast optimization algorithm operates with local, in other words restricted, parameter ranges it is necessary to prevent the optimization method ending in a local minimum of the cost function. This problem can be overcome by means of a suitable cost function as well as the correct choice of start values or the correct choice of a set of initial parameters. The risk of the optimization method ending in a local minimum can thereby be reduced.

In a preferred embodiment of the method according to the invention, for the preferably iterative optimization of the cost function a plurality of sets of alternative start values are therefore determined for the center frequencies assigned to different substances. In this situation, it is assumed for each of the sets of alternative start values that the primary maximum of the acquired frequency spectrum is assigned to a particular substance (water, fat, silicone) of the region under examination. Furthermore, a minimization of the cost function is carried out for each of the sets of alternative start values. This action serves to avoid the situation where, as a result of the choice of the start values, instead of the global minimum of the cost function a local minimum is determined and used for the calculation of the system frequency. When a plurality of sets of start values is used, after the optimization the global minimum of the cost function can still be found in a selection process. In other words, after the optimization the result with the best match of signal and model is used as the basis for the calculation of the system frequency, for example the water frequency.

In detail, the described procedure for up to three different substances (in this case water, fat and silicone) can proceed as follows. In order to set a number of start points, the following assumption is made: There is one primary maximum and the primary maximum is assigned to either the substance water, the substance fat or the substance silicone. The frequency $f_{max}$ and the amplitude $mag_{max}$ of the primary maximum are in this context determined on the basis of the frequency of the primary maximum of the acquired filtered frequency spectrum. A filtered frequency spectrum is to be understood as a frequency spectrum for the filtering of which, for example, a low-pass filter was used, such as for example a raised-cosine filter, the transmission function of which falls off with high frequencies. On this basis three start points or three sets of start values are calculated with the following parameters. The start values to be set concern the parameters fi0, wi and ai of the model function m(f). For the case that only two substances are contained in the region under examination the index i is accordingly restricted to 2.

It is first assumed for a first set of start values that the primary maximum of the measured and filtered frequency spectrum is assigned to the substance water. The start values for the stated parameters are then set as follows:

$$f_1^{water}=f_{max},\ f_2^{fat}=f_{max}-\text{diff}_{water,fat},\ f_3^{Si}=f_{max}-\text{diff}_{water,Si},$$

$$w_i=\text{diff}_{water,fat}/\text{def\_startFWHM}_{for\ i=1\ldots 3},$$

$$a_1^{water}=mag_{max},\ a_2,\ a_3=0.6*mag_{max}. \quad (9)$$

Here $f_1^{water}$ is the frequency assigned to the primary maximum of the filtered frequency spectrum which is assigned on a trial basis to the substance water for this set of start values, $f_2^{fat}$ is the frequency assigned to the substance fat of the corresponding secondary maximum and $f_3^{Si}$ is the frequency assigned to the substance silicone of the corresponding secondary maximum. The start values for the latter two frequencies can be obtained for example from the filtered frequency spectrum, where $\text{diff}_{water,fat}$ and $\text{diff}_{water,Si}$ are the reference values for the distances between the maxima to be found in the frequency spectrum. The start value for the width $w_i$ of the maxima of the frequency spectrum results in each case from the distance $\text{diff}_{water,fat}$ divided by the variable def_startFWHM which is set for example to the value 4 and may also be changed in an embodiment of the method. In general this value is obtained empirically.

It is, moreover, assumed for a second set of start values that the primary maximum of the measured and filtered frequency spectrum is assigned to the substance fat. The start values for the stated parameters are then set as follows:

$$f_1^{water}=f_{max}+\text{diff}_{water,fat}, f_2^{fat}=f_{max}, f_3^{Si}=f_{max}-\text{diff}_{fat,Si},$$

$$w_i=\text{diff}_{water,fat}/\text{def\_startFWHM}_{for\ i=1\ldots 3},$$

$$a_2^{fat}=\text{mag}_{max}, a_1, a_3=0.6*\text{mag}_{max}. \quad (10)$$

Here $f_2^{fat}$ is the frequency assigned to the primary maximum of the filtered frequency spectrum which is assigned on a trial basis to the substance fat, $f_1^{water}$ is the frequency assigned to the substance water and $f_3^{Si}$ is the frequency assigned to the substance silicone. The start values for the two frequencies $f_1$water and $f_3^{Si}$ can be obtained for example from the filtered frequency spectrum, where $\text{diff}_{water,fat}$ and $\text{diff}_{fat,Si}$ are the corresponding distances between the maxima to be found in the frequency spectrum. The start value for the width $w_i$ of the maxima of the frequency spectrum results in each case from the distance $\text{diff}_{water,fat}$ divided by the variable def_startFWHM which is set for example to the value 4 at the start. This variable may also be changed in an embodiment of the method.

It is also assumed for a third set of start values that the primary maximum of the measured and filtered frequency spectrum is assigned to the substance silicone. The start values for the stated parameters are then set as follows:

$$f_1^{water}=f_{max}+\text{diff}_{water,Si}, f_2^{fat}=f_{max}-\text{diff}_{fat,Si}, f_3^{Si}=f_{max},$$

$$w_i=\text{diff}_{water,fat}/\text{def\_startFWHM}_{for\ i=1\ldots 3},$$

$$a_3^{Si}=\text{mag}_{max}, a_1, a_2=0.6*\text{mag}_{max}. \quad (11)$$

Here $f_3^{Si}$ is the frequency assigned to the primary maximum of the filtered frequency spectrum which is assigned on a trial basis for this set of start values to the substance silicone, $f_1^{water}$ is the frequency assigned to the substance water and $f_2^{fat}$ is the frequency assigned to the substance fat. The start values for the two frequencies $f_1^{water}$ and $f_2^{fat}$ can be obtained for example from the filtered frequency spectrum, where $\text{diff}_{water,Si}$ and $\text{diff}_{fat,Si}$ are the corresponding distances between the maxima to be found in the frequency spectrum. The start value for the width $w_i$ of the maxima of the frequency spectrum results in each case from the distance $\text{diff}_{water,fat}$ divided by the variable def_startFWHM which is set for example to the value 4 at the start. This variable may also be changed in an embodiment of the method. It can in principle be obtained empirically.

To summarize, each set of start values, also referred to as a start point, is constructed as a vector $x_0$ having for example six or nine elements, depending on whether i=2 or 3, in other words whether the measured frequency spectrum is based on two different substances or three different substances. In the context of this definition the vector is $x_0=(f_i, w_i, a_i)$.

An iterative optimization is usually carried out. The optimizing iteration method is terminated, for example, when the cost function no longer changes or changes only very slightly. With the method according to the invention the objective is to find a frequency as precisely as possible; hence the frequency can alternatively be used directly as the termination criterion. This means that a specific quality of optimization is ensured and unnecessary iteration passes are avoided. As a result of the optimization, for example, the final value of the optimized cost function, the positions of the maxima, the widths of the maxima and the amplitudes of the maxima are output, in line with the optimized parameters of the model function.

In a variant of the method according to the invention, the quality of the optimization is assessed depending on whether the function value of the minimized cost function undershoots a threshold value. For example, in the case of ambiguous frequency spectra, it may occur that a precise determination of the system frequency is not possible. For this situation the quality test serves to indicate to the user that the user is unable to perform a reliable determination of the system frequency on the basis of the acquired frequency spectrum. In such a case of a poor match between signal and model, additional special methods can be applied in order to nevertheless determine the system frequency.

In a preferred embodiment of the method according to the invention, from the results of the minimization operations of the cost function based on different sets of start values, which result is selected to which the lowest minimized function value of the cost function is assigned. As already mentioned, it may occur that, in the case of optimizations having one set of start values, it is not the global minimum of the cost function that is determined. In order to avoid this, following a number of optimizations, a selection is made, on the basis of various sets of start values, of the start values that result in the global minimum of the cost function.

In an alternative embodiment of the method according to the invention, during the evaluation of the minimization it is determined whether the frequency spectrum assigned to the determined parameters of the optimized parameterized model function has a single maximum. The determination is implemented by checking whether the size ratio of one of the maxima exceeds a certain minimum value, also referred to as the single peak factor, in comparison with the other maxima. This check can take place on the basis of the results of the optimization that is assigned to the cost function having the lowest value.

In a preferred embodiment of the method according to the invention, in the event that the frequency spectrum of the optimized parameterized model function has a single maximum, which has been determined as described above, an additional peak is determined by reducing the detection threshold and the nature of the substance assigned to the single maximum is determined on the basis of the position of the additional peak, as is described in detail in the following.

In detail, in this embodiment a detection algorithm using the described threshold value is applied in order to find secondary maxima in the vicinity of the primary maximum or single maximum. The filtered spectral data is usually used for this step. With the algorithm the detection threshold is reduced step by step, for example halved with each pass, until at least one secondary maximum is found at a suitable distance or the lowest value for the detection threshold is reached. The distance of a secondary maximum is "suitable" when it is located at an interval of $+/-(\text{thl\_PeakDist}*f_s)$ away from the theoretical position. In this situation the value thl_PeakDist is obtained empirically.

If a number of secondary maxima are found, then the one with the greatest amplitude is used in order to decide whether the single maximum is assigned to water or fat. If no secondary maximum at all or no secondary maximum at a "suitable" distance has been found, the primary maximum is treated as a water maximum.

For the case that, in the presence of silicone, only a single maximum has been found, the detection threshold is reduced step by step, for example halved with each pass, until at least two secondary maxima are found at "suitable" distances or the lowest value for the detection threshold is reached. The type or the substance assigned to the respective maximum is determined on the basis of the positions of the secondary maxima. If no secondary maxima at all or no secondary maximum at a "suitable" distance has been found, the primary maximum is treated as a silicone maximum.

If no single maximum has been detected, which means that a number of maxima were available during the optimization and the optimization is reliable, then the result of the optimization to the set of start values for which the optimized cost function has the smallest value is selected from the number of results to the various sets of start values.

For the calculation of the system frequency, for the case of a single maximum, the values of the optimization are preferably used which are assigned to those start values which belong to the substance type which has been determined in the analysis described above as the substance type assigned to the single maximum. If the single maximum has for example been determined as a water maximum then the results assigned to the start values of equation (9) are used for the calculation of the system frequency. This preferably applies only in the event of the occurrence of a single maximum. Otherwise the selection of the results of the optimization is effected as already described, namely in such a manner that the results assigned to the optimized cost function having the lowest value are used for the calculation of the system frequency.

The calculation of the system frequency can be performed on the basis of a weighted mean value calculation depending on the frequency value of the primary maximum and the frequency values of at least one secondary maximum of the optimized modeled frequency spectrum, wherein the weightings are the determined amplitudes of the determined maxima of the optimized parameterized model function.

For example, in the event that water and fat are present as substance types in the region under examination, not only the position of the water maximum determined by the optimization but also the other maxima, in this case for example the fat maximum, are used for the calculation of the system frequency, in other words of the water frequency. If only a small water maximum but a highly pronounced fat maximum has been detected, the water frequency can be defined on the basis of the distance between the fat maximum and the water maximum. This is achieved by the stated weighted calculation:

$$f_w^{final} = \frac{a_1 \cdot f_1^0 + a_2 \cdot (f_2^0 + \Delta_{water}^{fat})}{a_1 + a_2}. \quad (12)$$

Here $f_w^{final}$ is the final result, in other words the definitively calculated system frequency. The weights $a_i$ result from the optimized and parameterized model function m(f). The distance $\Delta_{water}^{fat}$ is a reference value for the distance of the corresponding maxima or of the two frequencies f01, f02.

The method according to the invention is carried out particularly effectively on the assumption that the region under examination also comprises silicone in addition to water and fat. Furthermore, in this case the maximum assigned to the substance water is preferably weighted with the value 1 when calculating the system frequency.

This procedure takes into account the problem that the actual fat maximum is sometimes determined as a silicone maximum and in this case the frequency of the small water maximum would be overestimated.

Such a false estimation is avoided by the stated weighted calculation:

$$f_w^{final} = \frac{1 \cdot f_1^0 + a_2 \cdot (f_2^0 + \Delta_{water}^{fatt}) + a_3 \cdot (f_3^0 + \Delta_{water}^{silicone})}{1 + a_1 + a_2}. \quad (13)$$

Here $f_w^{final}$ is the final result, in other words the definitively calculated system frequency.

For the case described above where no suitable result is achieved with the use of the described optimization method, which can be recognized from the fact that the function values of the cost function exceed a predetermined threshold value, then a special method can be employed in order to obtain an estimate of the system frequency as follows: The maximum of the filtered frequency spectrum having the greatest amplitude is chosen and a detection threshold for a secondary maximum is again lowered step by step until a secondary maximum has been found at a "suitable" distance from the primary maximum. If a number of secondary maxima have been found, then the greatest secondary maximum dominates the following estimate. A decision is taken depending on the position of the secondary maximum as to whether the primary maximum is assigned to the substance water or the substance fat. The calculation of the system frequency is then carried out in accordance with equation 12. If no secondary maximum could be found at a "suitable" distance, then the primary maximum is regarded as a water maximum and the frequency thereof is used as the system frequency.

DESCRIPTION OF THE PREFERRED EMBODIMENTS

Figure 1:
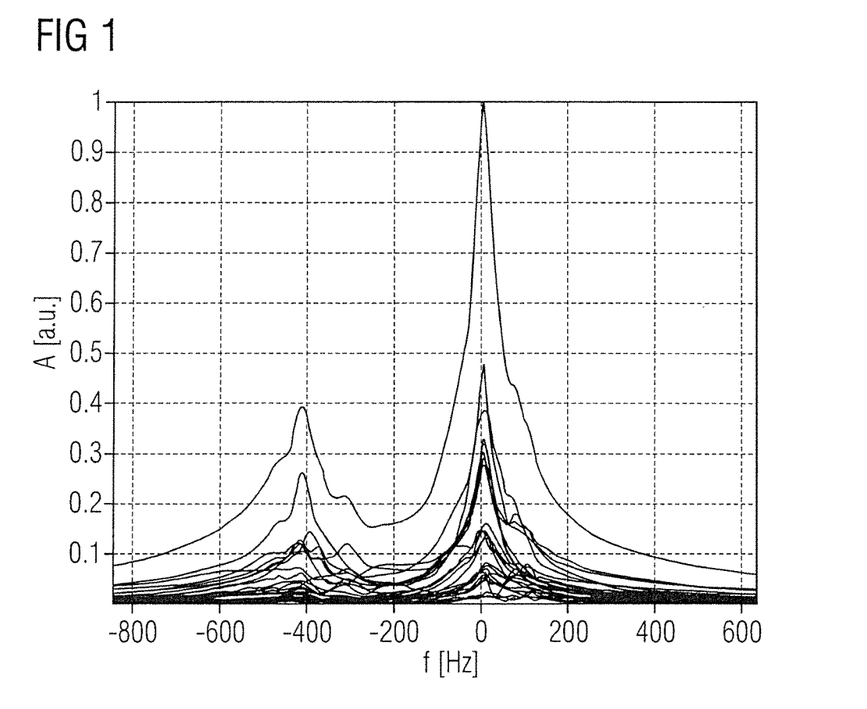
FIG. 1 is a graph of a frequency spectrum of a region under examination, measured using a plurality of channels.

FIG. 1 shows a frequency spectrum having two maxima of a stimulated echo generated when a so-called STEAM sequence is executed by an MR scanner. The amplitude A of the respective echo is plotted in arbitrary units a.u. against the frequency f or the deviation of the frequency from the system frequency. The individual spectral curves with the thin lines correspond in each case to the spectrum of an individual channel of the antenna system of the MR system. The thick uppermost line in the graph of FIG. 1 represents the aggregate total spectrum, or the total spectrum, which results from the sum of the squared individual spectra. The primary maximum can for example be correlated with the water frequency and the secondary maximum at −400 Hz can be correlated with fat.

Figure 2:
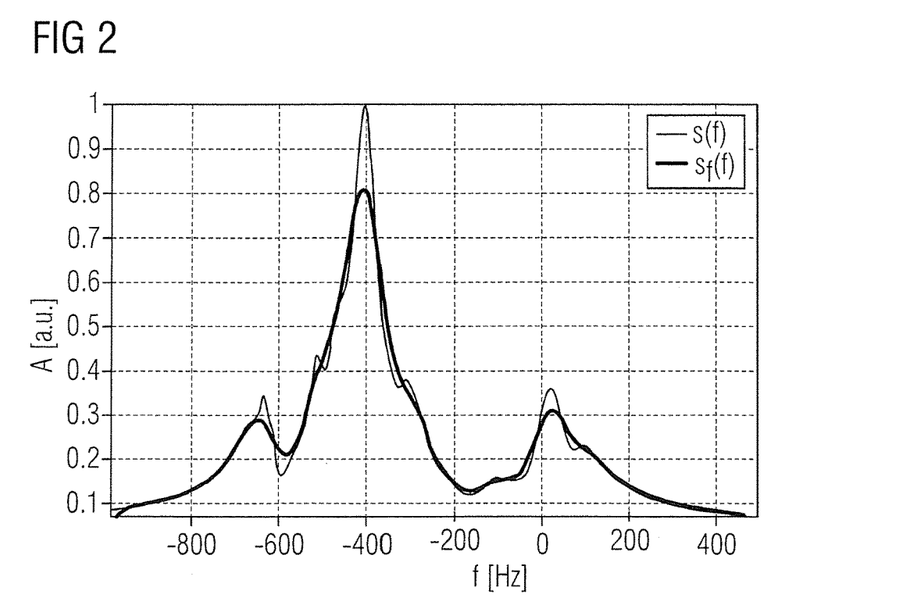
FIG. 2 is a graph of a filtered frequency spectrum.

FIG. 2 shows a total frequency spectrum s(f) having three maxima. Different substances, such as for example water, fat and silicone can for example be assigned to the individual maxima of the spectrum s(f). FIG. 2 furthermore shows a filtered frequency spectrum $s_f(f)$ which has been generated by a filtering of the original total frequency spectrum s(f). A typical threshold value of the filter used to generate the filtered frequency spectrum $s_f(f)$ is for example 1 ppm.

Figure 3:
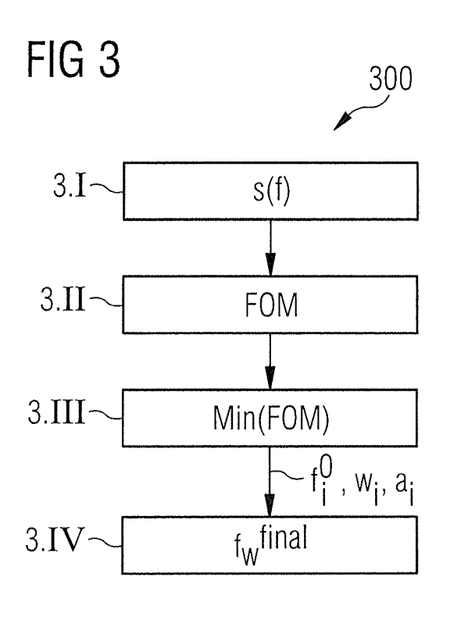
FIG. 3 is a flowchart that illustrates the method for determining a system frequency in accordance with a first exemplary embodiment of the invention.

FIG. 3 shows a flowchart used to illustrate a method 300 for determining a system frequency in MR imaging in accordance with an exemplary embodiment of the invention. In the step 3.I a frequency spectrum s(f) of a region under examination VOI is determined. The determination of the frequency spectrum s(f) can for example be carried out in the context of a test run in order to acquire a frequency spectrum. In the step 3.II a cost function FOM is determined. The cost function contains an expression which comprises the difference between a parameterized model function m(f) to be optimized and the acquired frequency spectrum s(f). It is particularly effective if the parameterized model function m(f) to be optimized and the acquired frequency spectrum s(f) are taken into consideration in the cost function by means of an expression which corresponds to a regression model according to the method of least squares. For example, the cost function disclosed by the equation 4 can be used as the cost function FOM. In addition, the cost function FOM preferably contains special weightings which also take into consideration empirical circumstances, such as for example the fact that the difference of the frequency or of the amplitude from various maxima of the frequency spectrum is normally in a particular range. The weightings also permit a certain flexibility, to also extend beyond certain boundaries and restrictions. Details relating to the choice of weightings and restriction factors are described in conjunction with the equations (5) to (8).

In the step 3.III the cost, function is minimized with the use of a fast optimization algorithm. This serves to advantageously prevent the iteration ending in a local minimum through the choice of a suitable cost function and a suitable start point. For example, it is also possible to choose a plurality of start points and perform the iteration with a plurality of start points. Furthermore, in the step 3.III the parameters $f_i^0$, $w_i$, $a_i$ of the optimized parameterized model function $m_{opt}(f)$ which are assigned to the determined minimum min(FOM) are determined. Finally, in the step 3.IV the correct system frequency $f_w^{final}$ is determined. This can be calculated, for example, from a weighted averaging of a plurality of frequency parameters $f_i^0$ in accordance with equation 12 or 13.

Figure 4:
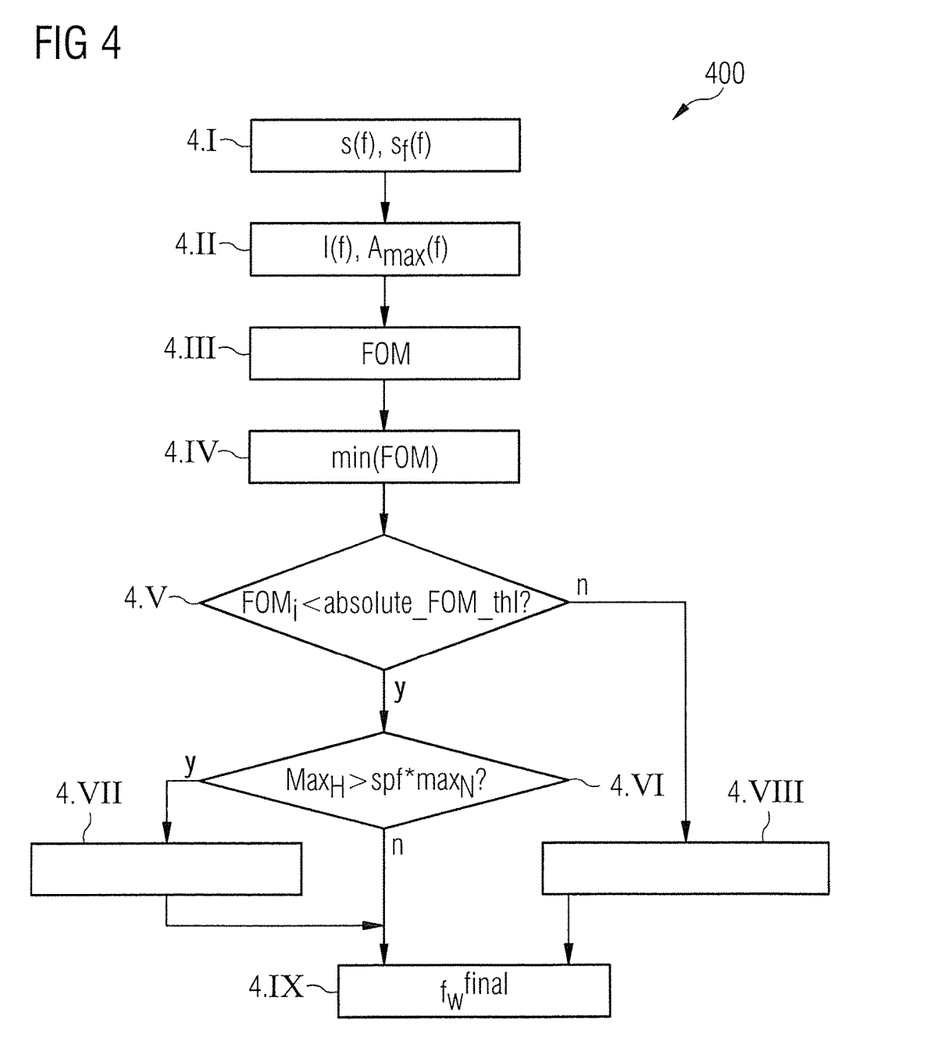
FIG. 4 is a flowchart that illustrates the method for determining a system frequency in accordance with a second exemplary embodiment of the invention.

FIG. 4 illustrates a method 400 in accordance with an exemplary embodiment of the invention, likewise in a flowchart, where the steps 4.I, 4.III, 4.IV and 4.IX correspond approximately to the steps 3.I, 3.II, 3.III and 3.IV while the steps 4.II, 4.V, 4.VI, 4VII and 4.VIII have no equivalent in the method 300 and offer additional improvements which enhance the performance and precision of the method 400.

In the step 4.I, similarly to the step 3.I a frequency spectrum s(f) of a region under examination VOI is determined, where a total frequency spectrum is generated by calculating the sum of squares of the spectra of the individual channels of an antenna system of the MR systems. Furthermore, a filtered frequency spectrum sf(f) as is shown in FIG. 2 is also determined. The filtered spectrum sf(f) is not used in all the following steps. The unfiltered spectrum for example is used when adapting the model function to the measurement data. In the step 4.II a preprocessing of the filtered spectral data sf(f) is firstly performed, wherein for example a frequency interval I(f) is defined on which the subsequent optimization is based. Furthermore for example, the global maximum of the frequency distribution or the amplitude $A_{max}(f)$ thereof is determined. In the step 4.III, as in the step 3.II, a cost function FOM is determined. The cost function contains an expression that is the difference between a parameterized model function m(f) to be optimized and the acquired frequency spectrum s(f).

In the step 4.IV, similarly to the step 3.III, an optimization of the cost function FOM is performed, wherein a plurality of optimization passes are carried out with sets of different start values. In this situation it is assumed for example in the first pass that the global maximum of the frequency spectrum s(f) corresponds to a frequency of water. In the second pass it is assumed for example that the global maximum corresponds to a frequency of fat, etc. In total therefore, depending on the choice of the start values, differing results ensue with regard to the optimization of the cost function FOM. In other words, different optimized cost functions FOM result. In the step 4.V, following termination of the minimization it is determined whether the smallest of the cost functions FOM, in other words the cost function $FOM_i$ having the smallest function values, lies below a predetermined threshold value absolute_$FOM_{13}$ thl. The predetermined threshold value absolute_FOM_thl can for example be defined in advance on the basis of empirical data. This test provides information about the reliability of the adaptation of the model function m(f) to the acquired spectral distribution s(f) achieved by the optimization.

If it has been determined in the step 4.V that the adaptation is reliable, in other words that the threshold value absolute_FOM_thl has not been exceeded by at least one of the optimized cost functions FOM, which is identified in FIG. 4 by "y", then in the step 4.VI it is determined whether a maximum $Max_H$ of the determined optimized parameterized spectral distribution $m_{opt}(f)$ is greater by a predetermined factor spf than all the other maxima $max_N$ in the determined optimized parameterized spectral distribution $m_{opt}(f)$. If this is the case, which is identified in FIG. 4 by "y", then in the step 4.VII a selection step is performed in order to select the correct single maximum. The filtered spectral data $s_f(f)$ is used for this, wherein a detection threshold value for the determination of lower maxima is decreased step by step until ultimately at least one additional adjacent local maximum is found at a distance from the primary maximum. Depending on the distance it is possible to conclude therefrom to which substance the primary maximum is to be assigned. If there is no secondary maximum, then it is assumed, for example, in the case of a fat-water mixture that the global maximum is assigned to the substance water. If silicone also forms part of the region under examination, then it is assumed that, if no secondary maximum is determined, the global maximum is assigned to the substance silicone.

If it is determined in the step 4.V that none of the optimized cost functions FOM satisfies the quality criterion, in other words that none of the optimized cost functions FOM lies beneath the predetermined threshold absolute_FOM_thl, which is identified in FIG. 4 by "n", then in the step 4.VIII a type of heuristic estimate of the system frequency is carried out. In this situation the filtered spectral data $s_f(f)$ is examined, wherein a threshold for the detection of a maximum is lowered step by step until two maxima are found. If the two maxima are situated at a suitable distance, then they are selected and the greater of the two maxima is assigned to the substance, for example water, from which it is expected that the substance generates the signal with the greatest amplitude. If no double maximum is found, then the primary maximum is assumed as the maximum which is assigned to the substance, for example water, from which it is expected that the substance generates the signal with the greatest amplitude. Subsequently in the step 4.IX an amplitude-weighted calculation of the correct system frequency $f_w^{final}$ is performed on the basis of the determined maxima.

Figure 5:
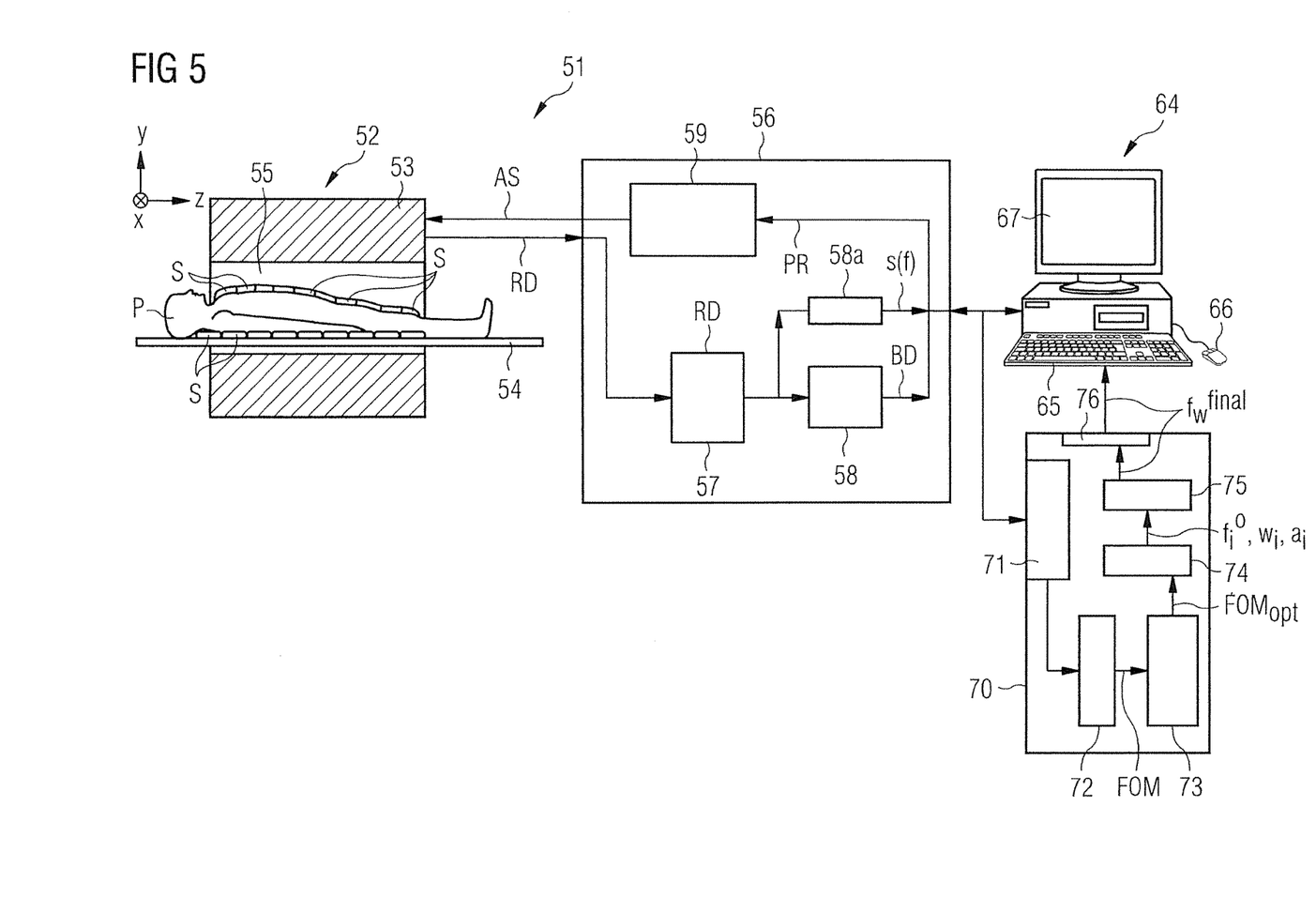
FIG. 5 is a schematic illustration of a magnetic resonance imaging system in accordance with an exemplary embodiment of the invention.

FIG. 5 shows an exemplary embodiment of a magnetic resonance system 51 according to the invention which is capable of operating in accordance with the method 300, 400 according to the invention. The basic components of the magnetic resonance system 51 is the magnetic resonance scanner 52 itself, in which a patient P is positioned on a patient support table 54 (also referred to as a bed 54) in an annular basic field magnet 53, which encloses the measurement chamber 55. A number of local coils S, also referred to as magnetic resonance RF coils, are located on and, where applicable, also under the patient.

The bed 54 can be moved in the longitudinal direction, in other words along the longitudinal axis of the scanner 52. This direction is referred to as the z axis in the likewise illustrated spatial coordinate system. Inside the basic field magnet in the scanner 52 is situated a whole-body coil, not illustrated in detail, with which radio-frequency pulses can be emitted and received. In addition, in the usual manner, not illustrated in the figure, the scanner 52 has gradient coils enabling that apply a magnetic field gradient in each of the spatial directions x, y, z.

The scanner 52 is controlled by a control computer 56 which is illustrated separately here. A terminal 64 is connected to the control computer 56. The terminal 64 has a screen 67, a keyboard 65 and a pointing device 66 for a graphical user interface, for example a mouse 66 or the like. The terminal 64 serves inter alia as a user interface via of which an operator operates the control computer 56 and thereby the scanner 52. Both the control computer 56 and the terminal 64 can also be an integral part of the scanner 52.

The magnetic resonance system 51 can also have all the further usual components or features of such systems, such as for example interfaces for connection to a communication network, for example of an image information system or the like. For clarity sake, however, all these components are not illustrated in FIG. 5.

An operator can communicate with the control computer 56 via the terminal 64 and thus ensure that the desired measurements are carried out, the scanner 52, for example, being controlled by the control computer 56 such that the requisite radio-frequency pulse sequences are emitted by the radio-frequency coils and the gradient coils are switched in a suitable manner. The raw data RD coming from the scanner 52 and required for the imaging are also required by the control computer 56. To this end, the control computer 56 has a raw data generation processor 57 in which detected signals from the scanner 52 are converted into raw data RD. This is achieved by digitizing the detected signals. A reconstruction algorithm is applied to the raw data RD to produce image data BD in a signal evaluation processor 58, which can be a module of the control computer 56. The image data BD can be visualized on the screen 67 of the terminal 64 and/or stored in a memory or transferred over a network. Furthermore the control computer 56 has a control sequence generation processor 59 which is used to determine a control sequence AS.

For example, the control sequence generation processor 59 receives from the terminal 64 protocol data PR that represent predetermined parameter values of a pulse sequence AS to be determined. The control sequence generation processor 59 is furthermore configured to provide a control sequence AS, as an output, toon the magnetic resonance scanner 52.

In addition, the magnetic resonance system 51 shown in FIG. 5 has a system frequency determination device 70. The system frequency determination device 70 is configured to determine a system frequency $f_w^{final}$ assigned to a region under examination VOI of a patient P. Depending on substances present at a particular position and the locally slightly variable magnetic field prevailing there, the system frequency may also vary locally. The measurement for determining the system frequency includes the output of a so-called STEAM sequence having three RF pulses, with which a stimulated echo is generated, where each of the three RF pulses coincides with selection gradients in one of the three spatial axes. The echo is Fourier transformed and the signals from all the coil elements are added together. The Fourier transform and addition can, for example, be performed with the use of a spectrum generation processor 58a that receives raw data acquired during the measurement from the raw data generation processor 57 and generates spectral data s(f). The generated spectrum s(f) is then transferred onward to the system frequency determination device 70 in accordance with an exemplary embodiment of the invention. The system frequency determination device 70 has an input interface 71 that is configured to receive the spectral data s(f) generated by the spectrum generation processor 58a and forward this to a cost function determination processor 72. The cost function determination processor 72 determines on the basis of the acquired frequency distribution s(f) and a parameterized model function m(f) a cost function FOM, which is the difference between the parameterized model function m(f) and the acquired frequency spectrum s(f).

The cost function FOM generated is transferred to an optimization processor 73 that minimizes the cost function FOM with the use of an optimization algorithm. The optimized cost function $FOM_{opt}$ is subsequently passed to an evaluation processor 74 which determines parameters $f_i^o$, $w_i$, $a_i$, assigned to the determined minimum min(FOM), of the parameterized model function $m_{opt}(f)$ corresponding to the minimum of the cost function. The optimized cost function FOM is assigned corresponding parameters $f_i^o$, $w_i$, $a_i$ of the parameterized model function m(f), which is referred to in this context as optimized model function $m_{opt}(f)$. The parameters $f_i^o$, $w_i$, $a_i$ determined by the evaluation processor 74 are subsequently transferred to a system frequency determination processor 75. The system frequency determination processor 75 then determines the correct system frequency $f_w^{final}$ on the basis of the received parameters $f_i^o$, $w_i$, $a_i$. This can be calculated, for example, from a weighted averaging of a number of frequency parameters $f_i^o$. The determined system frequency $f_w^{final}$ is subsequently transferred by an output interface 75 to the terminal 64. In the terminal 64 the system frequency $f_w^{final}$ taken into consideration when creating a protocol PR which when completed is transferred to the control computer 56. As already mentioned, the control computer 56 comprises a control sequence generation processor 59 that receives the protocol data PR from the terminal 64 which already have predetermined parameter values of a pulse sequence AS to be determined. From the control sequence generation processor 59, the generated control sequence AS is then provided to the magnetic resonance scanner 52 and the actual raw data acquisition can be performed using the control sequence AS adapted to the determined system frequency $f_w^{final}$.

The components of the system frequency determination device 70 required in a magnetic resonance system 51 in order to implement the invention, such as the cost function determination processor 72, the optimization processor 73 and the evaluation processor 74, can be created at least partially or completely in the form of software components. For example, the system frequency determination device 70 can also be part of the control computer 56. Normal magnetic resonance systems in any case have programmable control units, which means that the invention can be implemented in this manner preferably with the aid of suitable control software. In other words, a corresponding computer program product is loaded directly into the memory of a programmable control computer 56 of the magnetic resonance system 51 in question, which has program code in order to carry out the method 300 according to the invention. Existing magnetic resonance systems can also be upgraded simply and cost-effectively in this manner.

It is possible for some of the components to be also implemented as subroutines in components already present in the control computer 56 or for components that are present to also be used for the inventive purpose. This applies, for example, to the system frequency determination device 70, which can be implemented in a system frequency determination device that may already be present in an existing control computer 56.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a system frequency for magnetic resonance (MR) imaging, comprising:
   prior to operating an MR data acquisition scanner with a computer in order to acquire diagnostic MR data from an examination region of a subject, providing the computer with a frequency spectrum acquired from the examination region in the MR data acquisition scanner;
   in said computer, automatically determining a cost function that represents a difference between a predetermined model function that is parameterized with assigned parameters, and the acquired frequency spectrum;
   in said computer, executing a minimization algorithm that minimizes said cost function;
   in said computer, executing an optimization algorithm that optimizes said parameterized model function, to obtain an optimized parameterized model function in which at least one of said assigned parameter is changed as a result of said optimization algorithm, and determining parameters of said optimized parameterized model function corresponding to the minimized cost function; and
   in said computer, using the determined parameters to set said system frequency and emitting electronic control signals from said computer, that include a designation of said system frequency that has been set, to said MR data acquisition scanner and operating said MR data acquisition scanner at the set system frequency in order to acquire said diagnostic MR data from said examination region.

2. A method as claimed in claim 1 comprising employing, as said parameterized model function, a parameterized model function having a center frequency of a maximum of a frequency spectrum modeled by said parameterized model function, and comprising, as parameters, a width and an amplitude.

3. A method as claimed in claim 1 comprising determining said cost function as a sum of squares of the difference between the parameterized model function and the acquired frequency spectrum.

4. A method as claimed in claim 1 wherein said parameterized model function comprises, as parameters, a width and an amplitude, and wherein said cost function comprises weighting parameters that restrict differences of the respective widths and heights of multiple maxima of said parameterized model function.

5. A method as claimed in claim 1 comprising optimizing said cost function in an iterative optimization algorithm using a plurality of sets of alternative start values that are respectively determined for respective center frequencies of different substances, with each set of alternative start values being respectively for one of said different substances, and minimizing said cost function for each of said sets of alternative start values.

6. A method as claimed in claim 5 wherein said different substances are water, fat and silicone.

7. A method as claimed in claim 5 comprising, in said computer, evaluating a quality of the optimization of the cost function dependent on whether function values of the minimized cost function undershoot a threshold value.

8. A method as claimed in claim 7 comprising using, as the minimized cost function, the minimized cost function, respectively obtained from said different sets of start values that has the lowest minimized function value.

9. A method as claimed in claim 8 comprising evaluating said minimization of said cost function by determining whether a frequency function of the determined parameters of the optimized parameterized model function has a single maximum.

10. A method as claimed in claim 9 comprising, when said frequency spectrum of said optimized parameterized model function has said single maximum, determining, in said computer, an additional maximum of said frequency spectrum of the optimized parameterized model function by reducing said threshold, and determining a substance assigned to said single maximum dependent on a position of said additional maximum in said frequency spectrum of the optimized parameterized model function.

11. A method as claimed in claim 10 comprising calculating said system frequency as a weighted mean value calculation depending on the frequency value of a primary maximum and a frequency value of at least one secondary maximum of the optimized modeled frequency spectrum, each weighting in said weighted mean comprising a determined amplitude of respective maxima of the optimized parameterized model function.

12. A method as claimed in claim 11 wherein said different substances are water, fat and silicone, and comprising weighting the maximum for water with a value 1 when calculating said system frequency.

13. A magnetic resonance (MR) imaging apparatus comprising:
   an MR data acquisition scanner;
   a control computer configured to operate the MR data acquisition scanner in order to acquire diagnostic MR data from an examination region of a subject, once a system frequency for said MR data acquisition scanner has been set;

said control computer being configured to operate the MR data acquisition scanner, prior to acquiring said diagnostic data, in order to acquire a frequency spectrum of the examination region;

said control computer being configured to automatically determine a cost function that represents a difference between a predetermined model function that is parameterized with assigned parameters, and the acquired frequency spectrum;

said control computer being configured to execute a minimization algorithm that minimizes said cost function;

said control computer being configured to execute an optimization algorithm that optimizes said parameterized model function, to obtain an optimized parameterized model function in which at least one of said assigned parameter is changed as a result of said optimization algorithm, and determining parameters of said optimized parameterized model function corresponding to the minimized cost function; and said control computer being configured to use the determined parameters to set said system frequency and to emit electronic control signals from said computer, that include a designation of said system frequency that has been set, to said MR data acquisition scanner and to operate said MR data acquisition scanner at the set system frequency in order to acquire said diagnostic MR data from said examination region.

14. A non-transitory, computer-readable data storage medium encoded with programming instructions, said storage medium being loaded into a control computer of a magnetic resonance (MR) apparatus, which comprises an MR data acquisition scanner, said programming instructions causing said control computer to:

prior to operating said MR data acquisition scanner in order to acquire diagnostic MR data from an examination region of a subject, providing the computer with a frequency spectrum acquired from the examination region;

automatically determine a cost function that represents a difference between a predetermined model function that is parameterized with assigned parameters, and the acquired frequency spectrum;

execute a minimization algorithm that minimizes said cost function;

execute an optimization algorithm that optimizes said parameterized model function, to obtain an optimized parameterized model function in which at least one of said assigned parameter is changed as a result of said optimization algorithm, and determine parameters of said optimized parameterized model function corresponding to the minimized cost function; and use the determined parameters to set said system frequency and emit electronic control signals from said computer, that includes a designation of said system frequency that has been set, to said MR data acquisition scanner, and operate said MR data acquisition scanner at the set system frequency in order to acquire said diagnostic MR data from said examination region.

* * * * *